United States Patent [19]
Omote et al.

[11] Patent Number: 6,117,616
[45] Date of Patent: *Sep. 12, 2000

[54] CIRCUIT-FORMING SUBSTRATE AND CIRCUIT SUBSTRATE

[75] Inventors: Toshihiko Omote; Yasuhito Funada; Hideyuki Usui; Masanori Ueno; Kazumasa Igarashi, all of Osaka, Japan

[73] Assignee: Nitto Denko Corporation, Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/633,023

[22] Filed: Apr. 16, 1996

[30] Foreign Application Priority Data

| Apr. 17, 1995 | [JP] | Japan | 7-090658 |
| Apr. 17, 1995 | [JP] | Japan | 7-090659 |
| Aug. 1, 1995 | [JP] | Japan | 7-196437 |
| Aug. 1, 1995 | [JP] | Japan | 7-196438 |

[51] Int. Cl.⁷ .............................. G03F 7/09; B32B 15/08
[52] U.S. Cl. ...................... 430/275.1; 430/283.1; 430/273.1; 430/276.1; 430/277.1; 430/311; 430/18; 428/577; 428/603; 428/660; 428/606; 428/674; 428/209; 428/458

[58] Field of Search ...................... 428/577, 603, 428/606, 660, 674, 209, 458; 430/283.1, 273.1, 276.1, 277.1, 275.1, 311, 18

[56] References Cited

U.S. PATENT DOCUMENTS

| 4,906,803 | 3/1990 | Albrechta et al. | 174/254 |
| 5,145,553 | 9/1992 | Albrechta et al. | 156/640 |
| 5,338,826 | 8/1994 | St Clair | 428/458 X |

*Primary Examiner*—Cynthia Hamilton
*Attorney, Agent, or Firm*—Sughrue, Mion, Zinn, Macpeak & Seas, PLLC

[57] ABSTRACT

There are provided a circuit-forming substrate comprising a long stainless steel foil having formed on one surface or both surfaces thereof a polyimide resin layer wholly or partially, and a circuit substrate formed by using the circuit-forming substrate, wherein a conductor layer is finely patterned on the circuit-forming substrate. The circuit-forming substrate sufficiently satisfies low cost, high density and high reliability, scarcely causes warping of the substrate itself, and has excellent workability.

11 Claims, 3 Drawing Sheets

CIRCUIT-FORMING SUBSTRATE AND CIRCUIT SUBSTRATE

FIELD OF THE INVENTION

The present invention relates to a circuit-forming substrate and a circuit substrate, and more specifically to various kinds of mounting circuit-forming substrates and the circuit substrates. In particular, the present invention relates to a circuit-forming substrate as a part for forming an electric signal wire directly on a suspension for hard disk for which a high-capacity requirement and small-sizing have been recently hastened and to a circuit substrate obtained by the circuit-forming substrate.

BACKGROUND OF THE INVENTION

Recently, a thin-film multilayer substrate for aiming a high-density mount and high-speed signal processing of semiconductors has been watched with keen interest and, in general, a substrate formed by laminating a copper foil as an electrically conductive layer and a polyimide resin layer as a supporting layer is used. On such a substrate, a device is mounted, and since the device generates heat due to its characteristics, it has been desired to use a substrate material having a high heat-radiating effect such that heat does not accumulate in the inside of the system having incorporated therein the device.

As such a substrate, various circuit substrates having heat spreader have been proposed and for preparing these substrates, a so-called successive laminating method of using a sheet-form metal substrate having a high heat-radiating effect, coating a liquid resin on the substrate followed by drying, and thereafter, forming thereon a conductor layer, a press laminating method of press-working a copper-applied laminate layer plate and a metal plate having a large heat-radiating effect, etc., have been proposed.

However, the former method has a problem that since the step number for working is large, the cost becomes high and the latter method has a problem that since the accuracy for position matching is rough, it is difficult to obtain fine lines. Since these problems are fundamental problems in the practical use, the production method for the substrate with high reliability, high density, and low cost has not yet been actually realized.

On the other hand, from the points of obtaining a high storage capacity and high speed of a hard disk, in place of the conventional thin-film magnetic head which is MIG or a magnetic induction type, a so-called MR-thin-form composite type head formed by integrating a magnetic resistance-type MR element and a thin film has been watched with a keen interest. While in a conventional magnetic head, the reading and the writing of magnetic signals are both made by one head, since in the MR head, the reading and the writing are divisionally made by one head, the number of terminal becomes twice (if necessary, an earth terminal is further added) and it becomes necessary to fine the wire connecting the head to the disk body. However, when the wire is fined, the wire becomes liable to be corroded and also there occur the problems that it becomes reluctant to conform the impedances and also it becomes difficult to mount the head.

As a method of solving such new problems, a method of directly forming circuits on a suspension on which a head is mounted as described in JP-A-48-16620 (the term "JP-A" as used herein means an "unexamined published Japanese patent application").

However, if the materials constituting the substrate have different heat expansion coefficients (linear expansion coefficients), the substrate warps on the generation of heat. Also, if the water absorption of the polyimide resin layer being used for the circuit-forming substrate described above is high, for example, when such a substrate is incorporated in a hard disk body as a suspension, the dimensional change with the absorption or the desorption of water to or from the polyimide resin layer becomes large, the suspension itself warps to reduce the alignment accuracy, and it is also considered that there is a possibility of changing the interval between the disk and the disk body to cause an inferior performance as a device.

Also, the circuit-forming substrate or the circuit substrate is prepared by a sheet-form step of forming a polyimide resin layer and a conductor layer in order on a long stainless steel foil, and since the number of the production steps is large and the steps are complicated, the cost for producing the substrate is high.

Furthermore, if a three-layer substrate composed of a copper-applied laminated layer plate (for example, a two layer substrate composed of a polyimide resin layer and a copper foil) and a long stainless steel foil can be available, for pattern working of the polyimide resin layer, it is necessary to apply dry etching such as plasma etching, laser abrasion, etc. As a result, there is a possibility that the dry etching gives damages to the stainless steel foil and other wiring circuits and the cost becomes high with the reduction of the throughput. On the other hand, it may be considered to work the polyimide resin layer by wet etching but in this case, a toxic chemical such as hydrazine, etc., must be used as the processing liquid and hence the foregoing method is undesirable in the environmental sanitation.

Also, a circuit-forming substrate is not always used in a flat board state but as the case may be, it sometime happens that after making a circuit substrate by forming circuits on the circuit-forming substrate, the circuit substrate is processed by partially bending the circuit substrate at about 90 degree. When such a processing is applied, a stress is applied to the bent portion and thus there is a possibility that the polyimide resin layer constituting the substrate is cracked to cause an inferior insulation.

SUMMARY OF THE INVENTION

An object of the present invention is to solve the problems of the conventional techniques described above and to provide a circuit-forming substrate which sufficiently satisfies low cost (which is important from the point of view of practical use), high density and high reliability, scarcely causes warping of the substrate itself, and has excellent workability, i.e., when bending working of about 90 degree, at which a strong stress is added, is applied to the substrate, it shows a good adaptability of the polyimide resin layer at the bent portion, resulting in no inferior insulation and a circuit substrate obtained by the use of the circuit-forming substrate.

According to an aspect of the present invention, there is provided a circuit-forming substrate comprising a long stainless steel foil having formed on one surface or both surfaces thereof a polyimide resin layer wholly or partially.

Also, according to another aspect of the present invention, there is provided circuit substrate formed by using the circuit-forming substrate described above, wherein a conductor layer is finely patterned on the circuit-forming substrate.

Figure 1A:
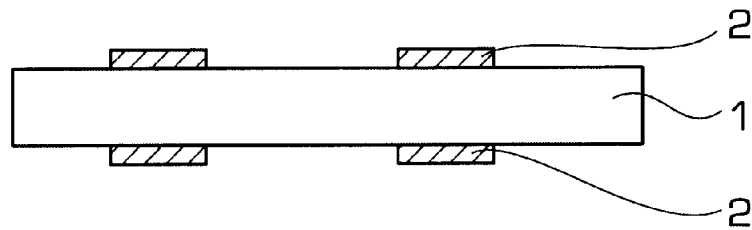
FIGS. 1(*a*), (*b*), and (*c*) are enlarged cross-sectional views showing the steps obtaining the circuit-forming substrate of the present invention, FIGS. 2(a), (b), and (c) are enlarged cross-sectional views showing the steps of obtaining other circuit-forming substrate of the present invention, FIGS. 3(a) and (b) are enlarged cross-sectional views showing the steps of obtaining still other circuit-forming substrate of the present invention.

In these figures, each numeral has the following meaning.

1: a long stainless steel foil
2: a polyimide resin layer
3: a conductor layer (metallizing layer)
4: a conductor layer (after electrolytic plating)

DETAILED DESCRIPTION OF THE INVENTION

The present invention is described in more detail below.

In particular, it is preferred from the point of preventing the occurrence of warping of the circuit-forming substrate that the difference (n) of the average linear expansion coefficient of the polyimide resin layer ($\alpha 1$) and the average linear expansion coefficient of the long stainless steel foil ($\alpha 2$) in the temperature range of from 5 to 200° C. is controlled in the range of from $-5$ ppm to 5 ppm.

A circuit-forming substrate having a conductor layer according to the present invention can be prepared by laminating a copper layer on the wholly formed polyimide resin layer or on the partially formed polyimide resin layer and the exposed stainless steel foil via a chromium layer or a titanium layer or without such a metal layer (i.e., directly).

For forming the patterns of a desired form, it is particularly preferred that the polyimide resin layer is formed by a photosensitive polyimide resin containing a photosensitive agent.

Furthermore, the circuit-forming substrate of the present invention is preferably used as a suspension for a hard disk. In this case, the substrate can exhibit its characteristics fully.

Also, from the point of preventing the occurrence of warping of the substrate, it is preferred that the difference (n) of the average linear expansion coefficient of the polyimide resin layer ($\alpha 1$) and the average linear expansion coefficient of the long stainless steel foil ($\alpha 2$) and the difference (m) of $\alpha 1$ and the average expansion coefficient of the conductor layer ($\alpha 3$) in the temperature range of from 5 to 200° C. each is controlled in the range of from $-5$ ppm to 5 ppm.

Furthermore, the present invention provides a circuit substrate prepared by using the foregoing circuit-forming substrate having formed thereon the fine patterns of conductor layer.

By preparing the circuit-forming substrate and the circuit substrate as described above, fine patterns having an excellent dimensional stability can be formed at a low cost and the excellent circuit substrate which is not accompanied by the phenomenon of warping the substrate and which does not cause cracking in the polyimide resin layer can be obtained without need of selecting the kind of the material constituting each layer.

Now, the polyimide resin being used for the circuit-forming substrate and the circuit substrate of the present invention is preferably a so-called total aromatic polyimide having the structural unit represented by formula (1) in the molecule:

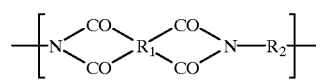

wherein $R_1$ represents a tetravalent aromatic group and is preferably at least one of

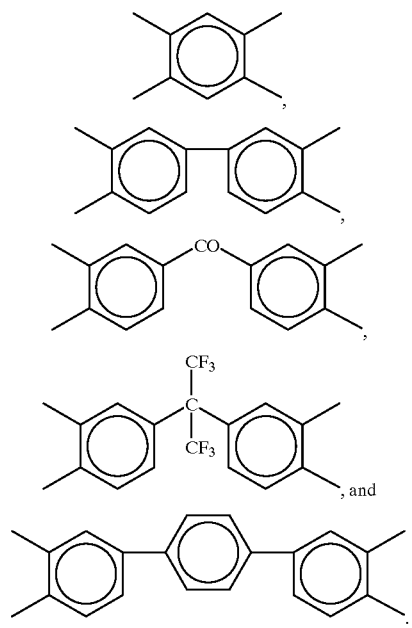

and $R_2$ represents a divalent aromatic group and is preferably at least one of

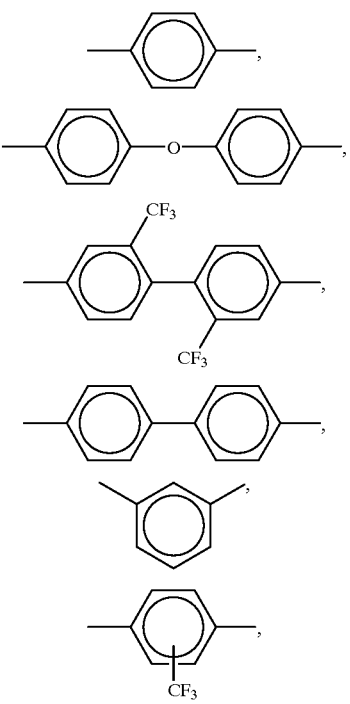

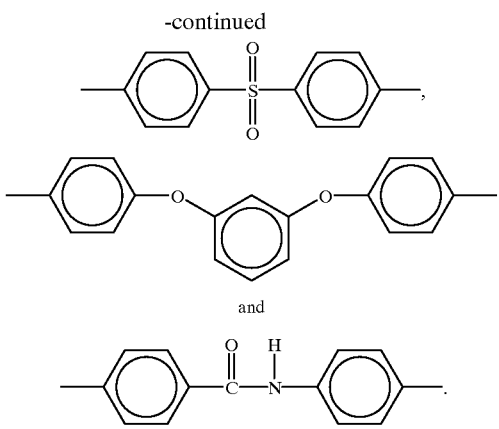

and

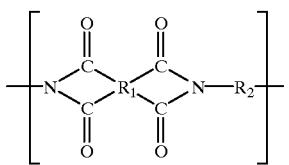

When the polyimide resin is formed on the long stainless steel foil in a layer form, it is preferred that the water absorption of the polyimide resin layer is 0.7% by weight or less, and preferably 0.5% by weight or less. For providing a polyimide resin layer having a water absorption falling within the above range, it is preferred to use a so-called total aromatic polyimide having the structural unit represented by formula (2) in the molecule:

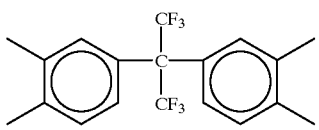

(2)

wherein $R_1$ represents a tetravalent aromatic group and is preferably

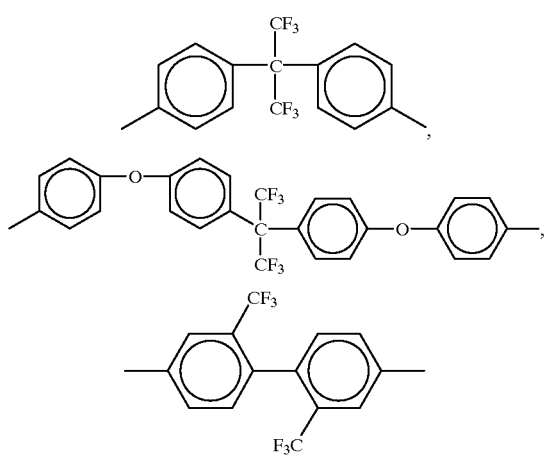

and $R_2$ represents a divalent aromatic group and is preferably at least one of

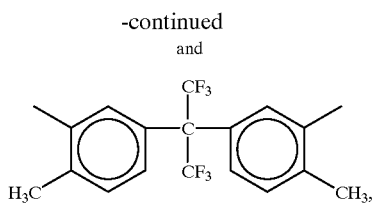

That is, when the polyimide resin layer having a water absorption of 7% by weight or less is formed on the long stainless steel foil, the polyimide resin layer becomes an insulating layer between the long stainless steel foil layer and the conductor layer formed thereon, whereby it becomes sufficiently possible that an electric signal wire can be freely circuit-designed thereon and even when the flexible stainless steel foil is used, a substrate showing less warping can be obtained. On the other hand, in the case of using polyimide resins conventionally used for circuit-forming substrates and circuit substrates, in particular, polyimide resins conventionally used as suspensions for hard disks, since the water absorption thereof is over 0.7% by weight and usually higher than 1.0% by weight, the effects of the present invention are not obtained. The terminology "water absorption" as used herein means the value obtained by conducting measurement of a water absorption by a Karl Fischer's method after allowing a sample to stand for 100 hours under a high-temperature and high-humidity condition of 85° C. and 85% R.H.

In addition, in the low-water absorption polyimide resins having the structural unit shown by formula (2) shown above, the particularly preferred resin is the polyimide resin of the formula wherein $R_1$ is 5,5'-(2,2,2-trifluoro-1-(trifluoromethyl)ethylidene]bis-1,3-isobenzofurandione and $R_2$ is 4,4'-dimethyl-3,3'-diaminodiphenylhexafluoropropane.

Also, when the polyimide resin is formed on a long stainless steel foil in a layer form, for making the elongation percentage of 20% or higher, and preferably 25% or higher, it is preferred to use a so-called total aromatic polyimide having the structural unit represented by formula (3) in the molecule:

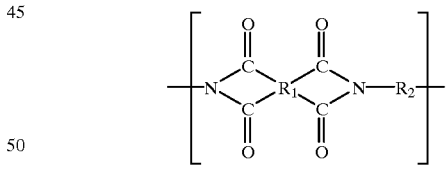

(3)

wherein $R_1$ represents a tetravalent aromatic group and $R_2$ represents a divalent aromatic group.

When the polyimide resin layer having an elongation percentage of 20% or higher is formed on a long stainless steel foil, the polyimide resin layer becomes an insulating layer between the stainless steel foil and a conductor layer being formed on the polyimide resin layer, whereby it becomes sufficiently possible that an electric signal wire can be freely circuit-designed thereon and also the terminal portion of the signal wire can be freely bent to be connected to other circuit. On the other hand, in the case of using polyimide resins conventionally used for circuit-forming substrates and circuit substrates, in particular, polyimide resins conventionally used as the suspensions for hard disk, a photosensitive polyimide resin having introduced therein a photopolymerizing group is used for finely patterning the polyimide resin layer, but the elongation percentage of such a photosensitive polyimide resin is lower than 20% and usually not more than 10%, thereby the effects of the present invention cannot be obtained. The terminology "elongation percentage" as used herein means the value obtained by dividing the elongation at breaking (breaking elongation) by the initial length of a test piece when elongation is measured at a temperature of 24 to 26° C. using a tensilon type tension test machine (manufactured by Toyo Boldwin Co.) under the condition that the width of the test piece is 2 mm, the interval between chucks is 5 mm, and the tensile speed is 5 mm/minute.

Among the polyimide resins having the structural unit shown by formula (3), the particularly preferred resin is the polyimide resin of formula (3) wherein $R_1$ is a biphenyl group and $R_2$ is a 1,4-bis(phenoxy)phenylene group.

The foregoing polyimide resin being used in the present invention preferably has the structural unit shown by formula (1), (2), or (3) in the molecule and has a relatively small linear expansion coefficient and water absorption and a relatively high elongation percentage, but as long as the linear expansion coefficient, the water absorption, and the elongation percentage are not largely affected, a copolymer or mixture of the foregoing polyimide resin with a polyimide resin having other structural unit, for example, a polyimide resin having a structural unit wherein $R_1$ and $R_2$ in formula (1), (2), or (3) are other groups than the groups described above, can be used.

The polyimide resin layer is formed on one surface or both surfaces of a long stainless steel foil. For synthesizing the polyimide resin, a polyimide precursor solution is first prepared using an organic solvent such as N-methyl-2-pyrrolidone, N,N-dimethylacetamide, N,N-dimethylformamide, 1,3-dimethyl-2-imidazolidinone, dimethyl sulfoxide, dimethyl sulfide, dimethylsulfone, pyridine, tetramethylurea, diglyme (diethylene glycol dimethyl ether), triglyme (triethylene glycol dimethyl ether), tetrahydrofuran, dioxane, cyclohexanone, hexamehylphosphoramide, etc. Then, the polyimide precursor solution is coated on a long stainless steel foil and dried to effect imidization, to thereby prepare a polyimide resin layer. Thus, the circuit-forming substrate of the present invention can be obtained (see, FIG. 1 (a)).

The thickness of the polyimide resin layer is generally from 3 to 25 $\mu$m, and preferably from 5 to 20 $\mu$m.

If the thickness of the polyimide resin layer is less than 3 $\mu$m, the voltage resistance of the layer may be low and the insulation reliance as an insulation layer may be lowered. If it is over 25 $\mu$m, even when the water absorption is 0.7% by weight or less and the elongation percentage is 20% or more, the residual stress is liable to become large to increase warping, failing to exhibit the desired effects.

As the long stainless steel foil, ferrite stainless steel, martensite stainless steel, austenite stainless steel, etc., can be used, and austenite stainless steel is preferably used, since it is excellent in the corrosion resistance, the bending property, the welding property, etc.

Also, the long stainless steel foil being used in the present invention is a stainless steel foil generally having a thickness of from 10 to 75 $\mu$m, and preferably from 10 to 40 $\mu$m, more preferably from about 20 to 30 $\mu$m, a width of from 100 to 300 mm, and preferably from about 110 to 250 mm, and a length of 10 meters or longer. If the thickness of the stainless steel foil is less than 10 $\mu$m, the foil is liable to be mechanically damaged and if it is over 40 $\mu$m, when the stainless steel foil is used as a spring material of the suspension for hard disk, a problem about the floating characteristics, etc. may be caused to fail to exhibit the sufficient characteristics.

Figure 2A:
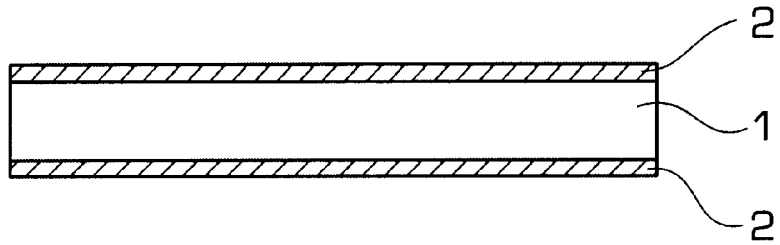
Figure 2B:
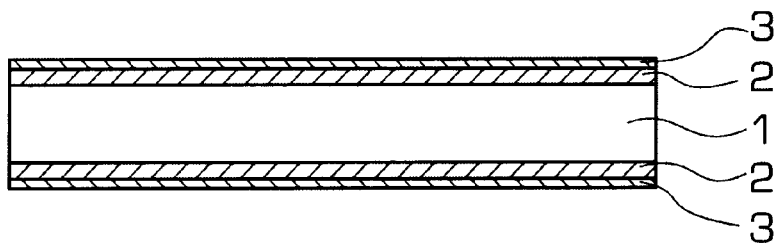
Figure 2C:
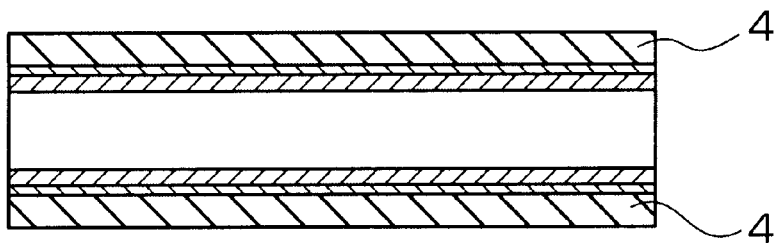

To the polyimide resin layer of the circuit-forming substrate of the present invention is applied, as occasion demands, pattern processing (see FIG. 2 (a)). Examples of the method of pattern processing include a method of using the photoinsensitive polyimide resin and a photoresist in combination and forming a pattern by applying thereto wet etching with hydrazine, etc. or applying dry etching such as plasma etching, laser etching, etc., and a method of using a positive-working or negative-working photosensitive polyimide resin and directly forming pattern thereon. In these methods, from the points of the working environment and lowering of the throughput about processing, it is preferred to use the photosensitive polyimide resin.

Figure 1B:
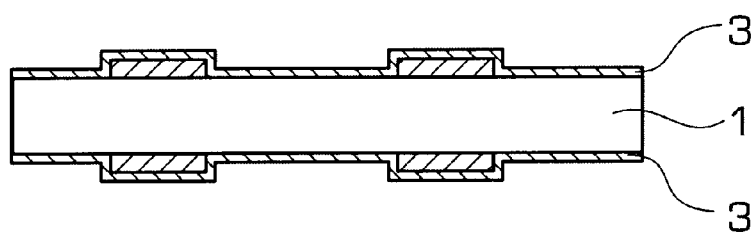
Figure 1C:
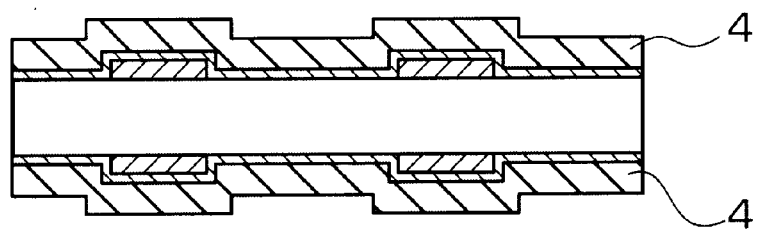

Also, a conductor layer is formed on the polyimide resin layer by laminating a copper layer thereon with or without using a chromium layer or a titanium layer under the conductor layer (see FIG. 1 (b) and FIG. 2 (b)). That is, the conductor layer is formed by metallizing the polyimide resin layer by forming a chromium/copper layer, a titanium/copper layer, or a copper layer on the polyimide resin layer. In this case, it is preferred from the point of the conformity of impedances that the thickness of the conductor layer this formed is from 2 to 20 $\mu$m, and more preferably from 5 to 15 $\mu$m.

As the method of forming the conductor layer, a chromium/copper layer, a titanium/copper layer, or a copper layer is formed on the foregoing polyimide resin layer by a continuous sputtering method such that the thickness of the metal layer becomes from about several hundreds to several thousands Å and thereafter electrolytic plating of copper is successively applied to thicken the thickness of the conductor layer as described above (see FIG. 1 (c) and FIG. 2 (c)). As other method than the sputtering method, for example, without carrying out the electrolytic plating treatment, the conductor layer can be formed by an EB (electron beam) vapor deposition method only. In addition, from the point of the adhesion reliability, if necessary, a chromium layer or a nickel layer may be formed on the conductor layer.

Figure 3A:
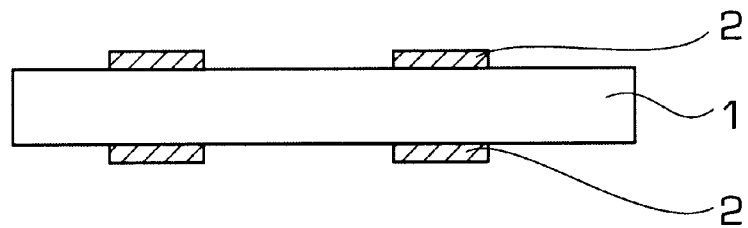
Figure 3B:
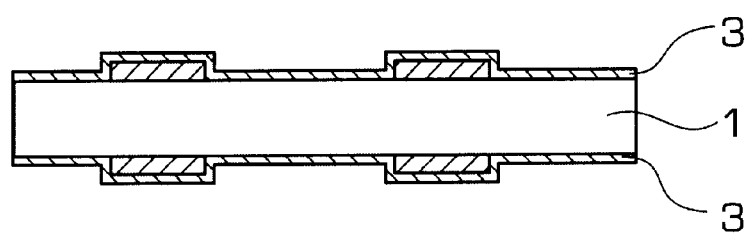
Figure 4:
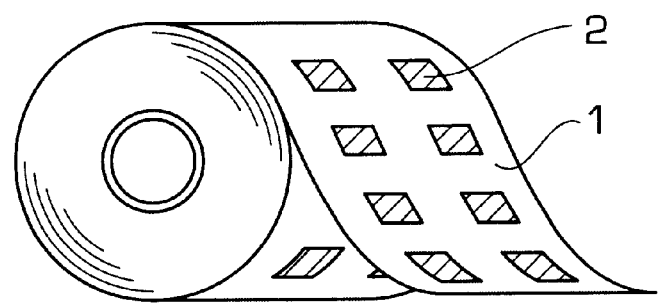
FIG. 4 is a slant view showing the state of winding the long substrate of FIG. 3 (a) in a roll form.

In addition, when the polyimide resin layer is partially formed on the long stainless steel foil as shown in FIG. 3 (a), the foregoing conductor layer is formed on the exposed long stainless steel foil and the partial polyimide resin layer as shown in FIG. 3 (b).

Then, an embodiment of the method of producing the circuit-forming substrate and the circuit substrate of the present invention is explained below.

First, a polyimide precursor being used for forming the polyimide resin layer is prepared by a known method and a solution of a polyamic acid which is the precursor for the polyamide resin having the structural unit shown by formula (1), (2), or (3) described above is obtained.

Then, the polyimide precursor (polyamic acid) solution is coated on a long stainless steel foil using a roll coater, a comma coater, a knife coater, a doctor blade, etc., and dried. In this case, the drying temperature is from about 60 to 120° C. to remove the organic solvent only and form a polyimide precursor layer.

When the polyimide precursor layer formed is patterned in a desired form, before coating the foregoing polyimide precursor solution, diethylaminoethyl methacrylate, Michler's ketone, etc., is added to the solution to impart a photosensitivity to the polyimide precursor solution. In this case, it is preferred from the point of photosensitivity that when diethylaminoethyl methacrylate is added to the solution, the compounding amount thereof is in the range of from 5 to 20 parts by weight, and more preferably from 10 to 15 parts by weight to 100 parts by weight of the solid component of the polyimide precursor and also when Michler's ketone is added, the compounding amount thereof is in the range of from 2 to 10 parts by weight, and more preferably from 2.5 to 5 parts by weight to 100 parts by weight of the solid component of the polyimide precursor. If the compounding amount of the additive is over the upper limit thereof described above, there are possibilities that the photosensitive agent is deposited and the thickness of the layer is greatly reduced at imidation.

The thus-formed polyimide precursor layer is irradiated with light through a photomask having a desired pattern, and since a long stainless steel foil is used in the present invention, a continuous long exposure machine is used. Then, the light-irradiated polyimide precursor layer is subjected to a continuous developing processing using a developer containing, as the main component, N-methyl-2-pyrrolidone, etc., which is usually used as a developer. From the points of the environmental sanitation and the working condition such as the prevention of explosion, etc., it is preferred to use not an organic solvent but an aqueous solution as the developer.

As the photosensitive agent which can be used in a system where an aqueous solution is used as the developer, the 1,4-dihydropyridine derivative described in JP-A-4-179685 is preferably used. If desired, a known sensitizer can be compounded in combination. Preferred examples of such a photosensitive agent include 2,6-dimethyl-3,5-dicyano-4-(2'-nitrophenyl)-1,4-dihydropyridine, 2,6-dimethyl-3,5-diacetyl-4-(2'-nitrophenyl)-1,4-dihydropyridine, 2,6-dimethyl-3,5-diacetyl-4-(2',4'-dinitriphenyl)-1,4-dihydropyridine, and 4-(2'-nitrophenyl)-2,6-dimethyl-3,5-dicarbomethoxy-1,4-dihydropyridine.

In such a 1,4-dihydropyridine series photosensitive agent, the molecular structure thereof exposed to an active light such as ultraviolet rays, etc., changes to a pyridine skeleton and becomes to have a basic property. Also, by heat treating at a temperature of from about 150 to 190° C., and preferably from 160 to 180° C. after light-exposure, the chemical reaction further proceeds and an interaction occurs between the photosensitive agent and the foregoing polyimide precursor to lower the solubility of the polyimide precursor in an alkali aqueous solution, whereby a negative pattern having a good contrast is obtained by the developing treatment.

As the alkali aqueous solution as the developer, an aqueous solution of an inorganic alkali such as sodium hydroxide, potassium hydroxide, etc., or an aqueous solution of an organic alkali such as propylamine, butylamine, monoethanolamine, tetramethylammonium hydroxide, choline, etc., can be used singly or as a mixture of them. From the points of the high purity and general usability, it is preferred to use an aqueous solution containing, as the main component, tetramethylammonium hydroxide as the developer. Furthermore, the alkali aqueous solution (developer) may further contain, if necessary, an alcohol and a surface active agent.

In the case of using such a photosensitive agent, the compounding amount of the photosensitive agent is generally in the range of from 5 to 70 parts by weight, and preferably from 15 to 55 parts by weight to 100 parts by weight of the solid component of the polyimide precursor in the polyimide precursor layer formed. If the compounding amount is less than the foregoing range, the dissolution preventing faculty of the light-exposed portions of the polyimide precursor layer is reduced, whereby the dissolution contrast is liable to become indistinct. If it is too large, there is a possibility that the deposition of the photosensitive agent occurs during storage of the compounded mixture in a solution state and further it sometimes happens that the thickness of the layer is greatly reduced at the heat treatment after forming pattern.

Then, the substrate obtained by forming the polyimide precursor on the long stainless steel foil is heated generally at a temperature of not lower than about 300° C., and preferably not lower than about 350° C. to cyclodehydrate the polyimide precursor, whereby the polyimide precursor is imidated to form a polyimide resin layer.

Such a heat treatment can be conducted using an apparatus such as a hot blast circulation type heating furnace, a far-infrared heating furnace, etc. For preventing the oxidative deterioration of the resin layer and the surface oxidation of the stainless steel foil, the heat treatment is carried out in an inert gas atmosphere such as an argon or nitrogen gas atmosphere or in vacuo such that the oxygen concentration is usually 1% by volume or lower, and preferably 0.1% by volume or lower.

The polyimide resin layer can be formed on one surface of the long stainless steel foil as described above, and formation of the polyimide resin layer on both surfaces of the stainless steel foil can be conducted by applying the same procedure to the other side of the stainless steel foil successively to the foregoing procedure.

In the case where the polyimide resin layer is formed on both surfaces of the long stainless steel foil and the polyimide resin layers are patterned, for the point of preventing the occurrence of warping and twisting of the substrate, it is preferred to form the patterns of the polyimide resin layers such that patterns of polyimide resin layers formed on both surfaces of the stainless steel foil correspond to each other.

The circuit-forming substrate of the present invention is obtained as described above, and the occurrence of the discrepancy of the circuit patterns and warping of the substrate itself by heat shrinkage can be prevented by controlling such that the difference (n) between the average linear expansion coefficient of the polyimide resin layer ($\alpha 1$) and the average linear expansion coefficient of the long stainless steel foil ($\alpha 2$) in the temperature range of from 5 to 200° C. falls within the range of from −5 ppm to 5 ppm. One ppm means $1 \times 10^{-6}$, that is $1 \times 10^{-4}\%$, and the linear expansion coefficient can be measured by a thermal mechanical analysis method (TMA method). The term "average linear expansion coefficient in the temperature range of from 5 to 200° C." can be obtained from inclination of the straight line connecting the point at 5° C. and the point at 200° C. in a figure having an abscissa showing a temperature and an ordinate showing an elongation. The average linear expansion coefficient in the temperature range of from 5 to 200° C. of the polyimide resin layer which can be used in the present invention is generally from 10 to 60 ppm.

The circuit-forming substrate of the present invention can be obtained by further forming an electrical conductor layer on the polyimide resin layer(s) formed. The method of forming the conductor layer is as described above.

Also, in the circuit-forming substrate having the conductor layer obtained as described above, it is preferred to control such that the difference (n) between the average linear expansion coefficient of the polyimide resin layer ($\alpha 1$) and the linear expansion coefficient of the long stainless steel foil ($\alpha 2$) and the difference (m) between $\alpha 1$ and the average linear expansion coefficient of the conductor layer ($\alpha 3$) in the temperature range of from 5 to 200° C. each is in the range of from −5 ppm and 5 ppm.

If the differences (n) and (m) are outside of the foregoing range, it tends to become reluctant to prevent the occurrence of warping of the circuit substrate.

The circuit-forming substrate having the conductor layer is subjected to an etching treatment to form a desired fine-line pattern. Thus, the circuit substrate of the present invention can be obtained. In particular, the long stainless steel foil is processed to a suspension for hard disk, thereby a wireless circuit substrate in a magnetic head can be provided.

As described above, the circuit-forming substrate of the present invention is composed of a long stainless steel foil having formed on one surface or both surfaces thereof a polyimide resin layer wholly or partially and further having formed on the polyimide resin layer(s) a specific conductor layer.

In particular, the use of the polyimide resin having the specific structural unit enables the linear expansion coefficient of the polyimide resin layer to be approximated to the linear expansion coefficient of the stainless steel foil and the water-absorbing property of the polyimide resin layer to be lowered. As a result, the occurrence of the warping phenomenon of the substrate can be restrained as less as possible. Furthermore, even when the circuit-forming substrate is subjected to various bending works, no cracks of the polyimide resin layer as the insulating layer occur and the substrate is excellent in the conformity.

Accordingly, when the conductor layer is processed to a fine-line pattern and is used as the suspension for hard disk, the invention shows the effects that the dimensional accuracy can be kept high, and the circuit-forming substrate and the circuit substrate having a practically high density and a high reliability can be provided.

Then, the present invention is explained in more detail by the following examples. All percentage and parts are by weight, unless otherwise indicated.

Example 1

A polyimide precursor was prepared by polymerizing pyromellitic acid dianhydride and an equimolar amount of 4,4'-diaminodiphenyl ether in N-methyl-2-pyrrolidone, uniformly coated by flow-casting on one surface of a long stainless steel foil (SUS 304, thickness 25 $\mu$m) using a comma coater and dried at about 80° C.

Then, the long stainless steel foil thus coated was placed in a continuous heating furnace in which the oxygen concentration was reduced to 0.1% by volume or less by replacing the inside atmosphere with a nitrogen gas, heated such that the highest temperature became 400° C. to imidate the polyimide precursor layer, whereby a circuit-forming substrate having the polyimide resin layer on one surface of the long stainless steel foil was prepared. Furthermore, on the other side of the circuit-forming substrate, a polyimide resin layer was formed by the same manner as above. Thus, a circuit-forming substrate having the polyimide resin layers on both surfaces of the long stainless steel foil was prepared.

Observation of the cross section of the circuit-forming substrate by a scanning type electron microscope proved that the thickness of the polyimide resin layer formed was about 5 $\mu$m in both surfaces. Also, where the substrate was placed in an atmosphere of 60° C., no warping phenomenon was observed and the state of the substrate was the same as at room temperature.

Example 2

To the polyimide precursor solution prepared in Example 1 were further added diethylaminoethyl methacrylate and Michler's ketone in an amount of 15 parts and 3 parts, respectively, to 100 parts of the solid component of the polyimide precursor to impart a photosensitivity to the polyimide precursor solution and thereafter, the solution was uniformly coated by flow-casting on a stainless steel foil (SUS 304, thickness 25 $\mu$m) and dried in the same manner as in Example 1.

Then, after light-irradiating (light having wavelengths of 400 nm or more at 1000 mJ/cm$^2$) the coated layer through a photomask having a desired pattern, the layer was developed using N-methyl-2-pyrrolidone to form the polyimide precursor layer having the desired pattern.

Then, the layer was imidated by the same method as in Example 1 to provide a circuit-forming substrate having the patterned polyimide resin layer on one surface of the long stainless steel foil.

On the other surface of the circuit-forming substrate thus obtained was formed a patterned polyimide resin layer in the same manner to provide the circuit-forming substrate having on both surfaces of the long stainless steel foil the patterned polyimide resin layers. For forming each polyimide resin pattern on both surfaces of the long stainless steel foil at the conformity positions to each other, holes for position matching are previously formed in a part of the stainless steel foil and the alignment was carried out accurately.

Observation of the cross section of the circuit-forming substrate by a scanning-type electron microscope proved that the thickness of the polyimide resin layer formed was about 5 $\mu$m in both sides, and the position discrepancy of the patterns on both the surfaces was ±10 $\mu$m in the width of 10 cm. Also, where the substrate was placed in an atmosphere of 60° C., no warping phenomenon was observed and the state of the substrate was the same as at room temperature.

Example 3

A circuit-forming substrate having on both surfaces of the long stainless steel foil was prepared in the same manner as in Example 1 except for using 3,3',4,4'-benzophenone-tetracarboxylic acid dianhydride in place of pyromellitic acid dianhydride.

Observation of the cross section of the circuit-forming substrate by a scanning-type electron microscope proved the thickness of the polyimide resin layer was about 5 $\mu$m in both sides. Also, where the substrate was placed in an atmosphere of 60° C., no warping phenomenon was observed and the state of the substrate was the same as at room temperature. That is, the circuit-forming substrate having the structure according to the present invention did not show a warping phenomenon though the kind of the polyimide resin was changed. Thus, it was confirmed that there was no selectivity on the materials.

Example 4

After adding 4-(2'-nitrophenyl)-2,6-dimethyl-3,5-dicarbomethoxy-1,4-dihydropyridine (customary name: nifedipine) to the polyimide precursor solution prepared in Example 1 in an amount of 30 parts to 100 parts of the solid component of the foregoing polyimide precursor to impart a photosensitivity to the polyimide precursor solution, the resulting solution was uniformly coated by flow-casting on a long stainless steel (SUS 304, thickness 30 $\mu$m) in the same manner as in Example 1 and dried at 80° C.

Then, after light-irradiating (wavelengths of from 360 to 440 nm, irradiation energy 500 mJ/cm$^2$) the coated layer through a photomask having a desired pattern, the exposed layer was further heat treated at 160° C. Thereafter, the layer was developed with a mixed solution of an aqueous solution of 5% by weight tetramethylammonium hydroxide and ethyl alcohol (2/1 by volume) as the developer at 40° C., washed with water, and dried to form a polyimide precursor layer having the desired pattern.

Then, the stainless foil having the polyimide precursor layer was heated in a batch atmosphere heating furnace in a vacuum state (0.1 torr) such that the highest temperature became 380° C. to imidate the polyimide precursor layer to provide a circuit-forming substrate of the present invention having the patterned polyimide resin layer (thickness about 5 μm) on one surface of the long stainless steel foil.

The pattern obtained had a good form of a positive taper and when the similar patterned polyimide resin layer was formed on the other surface of the substrate as in Example 2, a warping phenomenon was not observed.

Example 5

The circuit-forming substrate having on one surface of the long stainless steel foil the patterned polyimide resin layer (thickness about 5 μm) obtained in Example 4 was continuously subjected to a metallizing treatment with chromium and copper in the same batch using a long sputtering apparatus. Then, the same metallizing treatment was applied to the other side of the substrate not having the polyimide resin layer. Observation of the cross section by a scanning type electron microscope proved that the thickness of the chromium layer was 500 Å and the thickness of the copper layer was 1,000 Å in both surfaces.

Then, electrolytic plating treatment of copper was applied to further form a copper layer within one hour after applying the sputtering treatment so as not to lower the activity of the sputtered layers. Thus, the circuit-forming substrate having a conductor layer was obtained.

Measurement of the plated layer by a stylus type surface roughness tester proved that the plated layer had a thickness of from 9 to 10 μm with 10 cm square width and a layer thickness accuracy of 9 μm ±10%.

Also, since the substrate scarcely showed a warping phenomenon, it was confirmed that the circuit substrate prepared by processing the conductor layer ensured a high dimensional accuracy.

Example 6

A polyimide precursor solution was prepared by polymerizing pyromellitic acid dianhydride and an equimolar amount of 4,4'-diaminodiphenyl ether/paramine (15/85% by mole) in N-methyl-2-pyrrolidone, diethylaminoethyl methacrylate and Michler's ketone were added thereto in an amount of 15 parts and 3 parts, respectively, to 100 parts of the solid component of the precursor to impart a photosensitivity to the polyimide precursor solution, the resulting solution was uniformly coated on a long stainless steel foil (SUS 304, thickness 25 μm) by flow-casting and dried in the same manner as in Example 1.

Then, after light-irradiating (wavelengths not shorter than 400 nm, at 1,000 mJ/cm$^2$) the coated layer through a photomask having a desired pattern, the exposed layer was developed using N-methyl-2-pyrrolidone to form the polyimide precursor layer having the desired pattern on the necessary portions only of the stainless steel foil.

Then, the polyimide precursor layer was imidated by the same method as in Example 1 to provide a circuit-forming substrate having the patterned polyimide resin layer on one surface of the long stainless steel foil.

Observation of the cross section of the circuit-forming substrate by a scanning type electron microscope proved that the thickness of the polyimide resin layer was about 5 μm. Also, where the substrate was placed in an atmosphere of 60° C., no warping phenomenon was observed and the state of the substrate was the same as at room temperature.

Example 7

A circuit-forming substrate having a polyimide resin layer on one surface of the long stainless steel foil was prepared in the same manner as in Example 6 expect that a polyimide precursor solution was prepared using 3,3',4,4'-benzophenonetetracarboxylic acid dianhydride in place of pyromellitic acid dianhydride and the compounding amount of Michler's ketone as the photosensitive agent was changed to 10 parts.

Observation of the cross section of the substrate by the scanning electron microscope proved that the thickness of the polyimide resin layer was about 5 μm. Also, where the substrate was placed in an atmosphere of 60° C., no warping phenomenon was observed. That is, the circuit-forming substrate having the structure of the present invention did not show a warping phenomenon though the kind of the polyimide resin was changed. Thus, it was confirmed that there was no selectivity on the material.

Example 8

To the polyimide precursor solution prepared in Example 6, 4-(2'-nitrophenyl)-2,6-dimethyl-3,5-dicarbomethoxy-1,4-dihydropyridine (customary name: nifedipine) was added in an amount of 30 parts to 100 parts of the solid component of the polyimide precursor to impart the photosensitivity to the polyimide precursor solution. The resulting solution was uniformly coated on a long stainless steel foil (SUS 304, thickness 30 μm) by flow-casting in the same manner as in Example 1 and dried at 80° C.

Then, after light-irradiating (wavelengths of from 360 to 440 nm, irradiation energy 500 mJ/cm$^2$) the coated layer through a photomask having a desired pattern, the exposed layer was heat-treated at 160° C. Thereafter, the exposed layer was developed with a mixed solution of an aqueous solution of 5% by weight tetramethylammonium hydroxide/ ethyl alcohol (2/1 by volume) as a developer at 40° C., washed with water, and dried to form the polyimide precursor layer having the desired pattern.

Then, the long stainless steel foil having formed thereon the polyimide precursor layer having the pattern was heated in a batch atmosphere heating furnace in a vacuum state (0.1 torr) such that the highest temperature became 380° C. to imidate the polyimide precursor layer. Thus, a circuit-forming substrate having the patterned polyimide resin layer (thickness about 5 μm) on one surface of the long stainless steel foil was prepared.

The pattern obtained had a good form of a positive taper and no warping phenomenon was observed on the substrate.

Example 9

A polyimide precursor solution was prepared in the same manner as in Example 6 except that 3,3'4,4'-biphenyl-tetracarboxylic acid dianhydride was used in place of pyromellitic acid dianhydride and the diamine components were replaced with a mixture of 20 mol % 4,4-diaminodiphenyl ether and 80 mol % paramine.

The polyimide precursor solution was coated in the same manner as in Example 8 except that the coated layer of the polyimide precursor solution was heated in curing (imidation) after forming pattern such that the highest temperature became 420° C. Thus, a circuit-forming substrate having a patterned polyimide resin layer (thickness about 5 μm) on one surface of the long stainless steel foil was prepared.

The circuit-forming substrate has α1 of 18 ppm, α2 of 17.3 ppm, and the difference (n) of 0.7.

Example 10

The circuit-forming substrate having the patterned polyimide resin layer (thickness about 5 μm) on one surface of the long stainless steel foil obtained in Example 9 described above was continuously subjected to a metallizing treatment with chromium and copper in a batch using a long sputtering apparatus. Similarly, the metallizing treatment was applied to the other surface of the stainless steel not having the polyimide resin layer. Observation of the cross section by a scanning electron microscope proved that the thickness of the chromium layer was 500 Å and the copper thickness was 1,000 Å in both the surfaces.

Then, electrolytic plating treatment of copper was applied to further form a copper layer within one hour after applying the sputtering treatment so as not to lower the activity of the sputtered layers. Thus, the circuit-forming substrate having a conductor layer was obtained.

Measurement of the plated layer by a stylus type surface roughness tester proved that the plated layer had a thickness of from 9 to 10 μm with 10 cm square width and a layer thickness accuracy of 9 μm ±10%.

Also, since a warping phenomenon was scarcely observed on the substrate, it was confirmed that the circuit substrate prepared by processing the conductor layer ensured a high dimensional accuracy.

The circuit-forming substrate had α1 of 18 ppm, α2 of 17.3 ppm, and α3 of 18 ppm, the difference (n) of 0.7 ppm and the difference (m) of 0 ppm.

Comparative Example 1

A circuit-forming substrate was prepared in the same manner as in Example 6 except that 4,4'-diaminodiphenyl ether was used in place of paramine.

As a result, the form of the polyimide resin layer on the surface of the long stainless steel foil clearly appeared on the back surface side of the stainless steel foil and it became clear that a large stress existed between the polyimide resin layer and the stainless steel foil.

The circuit-forming substrate has α1 of 35 ppm, α2 of 17.3 ppm, and the difference (n) of 17.7 ppm.

Comparative Example 2

A circuit-forming substrate was prepared in the same manner as in Example 6 expect that the amine component all was replaced by the compound represented by formula (1) where $R_2$ was 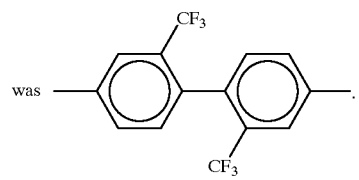.

As a result, the substrate caused warping at the stainless steel foil side, and has α1 of −7 ppm, α2 of 17.3 ppm, and the difference (n) of −24.3 ppm.

Example 11

A polyimide precursor solution was prepared by polymerizing pyromellitic acid dianhydride/5,5'-[2,2,2-trifluoro-1-(trifluoromethyl)ethylidene]bis-1,3-isobenzofurandione and an equivalent amount of 4,4'-diaminodiphenyl ether/4,4'-dimethyl-3,3'-diaminodiphenylhexafluoropropane in N-methyl-2-pyrrolidone and to the solution were further added diethylaminoethyl methacrylate and Michler's ketone in an amount of 15 parts and 3 parts, respectively, to 100 parts of the solid component of the polyimide precursor to prepare a photosensitive liquid.

The photosensitive liquid thus obtained was uniformly coated by flow-casting on a long stainless steel foil (SUS 304, thickness 25 μm) using a comma coater and dried at about 80° C. to form a polyimide precursor layer having a photosensitivity.

Then, after light-irradiating (wavelengths of not shorter than 365 nm, at 1,000 mJ/cm²) the coated layer from the polyimide precursor layer side through a photomask having a desired pattern, the light-exposed layer was developed using N-methyl-2-pyrrolidone to form a polyimide precursor layer having the desired pattern on the long stainless steel foil.

Then, the long stainless steel foil having formed thereon the pattern-having polyimide precursor layer was placed in a continuous heating furnace wherein the oxygen concentration was adjusted to 0.1% by volume or less by replacing the inside atmosphere with a nitrogen gas and heated such that the highest temperature became 400° C. to imidate the polyimide precursor layer, whereby a circuit-forming substrate having the polyimide resin layer on one surface of the long stainless steel foil was prepared.

Observation of the cross section of the circuit-forming substrate by a scanning type electron microscope proved that the thickness of the polyimide resin layer was about 5 μm. Also, when the substrate was allowed to stand for 100 hours in an atmosphere of 85° C. and 85% R.H., the water absorption of the polyimide resin layer was about 0.5% by weight. The elongation percentage of the polyimide resin layer was about 0.1%, i.e., the polyimide resin layer did not substantially show elongation, and in the circuit-forming substrate, the form was not changed before and after absorbing water and a warping phenomenon was not observed.

Example 12

A circuit-forming substrate having a polyimide resin layer on one surface of the long stainless steel foil was prepared in the same manner as in Example 11 except that 3,3',4,4'-benzophenonetetracarboxylic acid dianhydride was used in place of pyromellitic acid dianhydride and the compounding amount of Michler's ketone was changed to 10 parts.

The water absorption of the polyimide resin layer of the substrate was about 0.5% by weight and the elongation percentage thereof was about 10%. Also, no change of the form (warping phenomenon) was observed before and after absorbing water. That is, the circuit-forming substrate having the structure of the present invention did not show a warping phenomenon though the kind of the polyimide resin was changed. Thus, it was confirmed that there was no selectivity on the material.

Example 13

To the polyimide precursor solution prepared in Example 11, 4-(2'-nitrophenyl)-2,6-dimethyl-3,5-dicarbomethoxy-1,4-dihydropyridine (customary name: nifedipine) as the photosensitive agent was added in an amount of 30 parts to 100 parts of the solid component of the polyimide precursor to impart a photosensitivity to the polyimide precursor solution. The resulting solution was uniformly coated on a long stainless steel foil (SUS 304, thickness 30 μm) by flow-casting in the same manner as in Example 11 and dried at 80° C.

Then, after light-irradiating (wavelengths of from 360 to 440 nm, irradiation energy 500 mJ/cm$^2$) the coated layer through a photomask having a desired pattern, the layer was heat treated at 160° C. Thereafter, the light-exposed layer was developed with a mixed solution of a 5% by weight aqueous solution of tetramethylammonium hydroxide/ethyl alcohol (2/1 by volume) as a developer at 40° C., washed with water, and dried to form a polyimide precursor layer having a desired pattern.

Then, the long stainless steel foil having formed thereon the patterned polyimide precursor layer was heated in a batch atmosphere heating furnace in a vacuum state such that the highest temperature became 380° C. to imidate the polyimide precursor layer, whereby a circuit-forming substrate having the patterned polyimide resin layer (thickness about 5 μm) on one surface of the long stainless steel foil was prepared.

The pattern obtained had a good form of a positive taper, the water absorption of the polyimide resin layer was 0.6% by weight, and the change of the form of the substrate (warping phenomenon) before and after absorbing water was not observed.

Example 14

The circuit-forming substrate having the patterned polyimide resin layer (thickness about 5 μm) on one surface of the long stainless steel foil obtained in Example 13 was continuously subjected to a metallizing treatment with chromium and copper in the same batch using a long sputtering apparatus. Observation of the cross section of the substrate by a scanning type electron microscope proved the thickness of the chromium layer was 500 Å and the thickness of the copper layer was 1,000 Å.

Then, electrolytic plating treatment of copper was applied to further form a copper layer within one hour after applying the sputtering treatment so as not to lower the activity of the sputtered layers. Thus, the circuit-forming substrate having a conductor layer was obtained.

Measurement of the plated layer by a stylus type surface roughness tester proved that the plated layer had a thickness of from 9 to 10 μm with 10 cm square width and a layer thickness accuracy of 9 μm ±10%.

Since the obtained substrate hardly exhibit a warping phenomenon even under a pressure cookered test (121° C./2 atms), it was confirmed that the circuit substrate prepared by processing the conductor layer ensured a high dimensional accuracy.

Comparative Example 3

A circuit-forming substrate was prepared in the same manner as in Example 11 except that pyromellitic acid dianhydride and 4,4'-diaminodiphenyl ether were used in place of the monomers used for synthesizing the polyimide precursor.

The water absorption of the polyimide resin layer of the prepared substrate was 1.5% by weight and the dimensional change (elongation) of the polyimide resin layer before and after absorbing water was higher than about 1%. Also, the substrate warped to the polyimide resin layer side before absorbing water, but the substrate became flat after absorbing water and thus it was confirmed that the substrate caused a large change of form (change of warping) by absorbing water.

Example 15

A polyimide precursor solution was prepared by polymerizing pyromellitic acid dianhydride and an equimolar amount of 4,4'-diaminophenyl ether in N-methyl-2-pyrrolidone and diethylaminoethyl methacrylate and Michler's ketone were added thereto in an amount of 15 parts and 3 parts, respectively, to 100 parts of the solid component of the polyimide precursor, to thereby prepare a photosensitive liquid.

The photosensitive liquid was uniformly coated on a long stainless steel foil (SUS 304, thickness 25 μm) by flow-casting using a comma coater and dried at about 80° C. to form a polyimide precursor layer having a photosensitivity.

Then, after light-irradiating (with the light having the wavelengths of not shorter than 365 nm at 1,000 mJ/cm$^2$) the coated layer through a photomask having a desired pattern, the light-exposed layer was developed using N-methyl-2-pyrrolidone to form the polyimide precursor layer having the desired pattern on the long stainless steel foil.

Then, the resulting long stainless steel foil was placed in a continuous heating furnace in which the oxygen concentration was reduced to 0.1% by volume or less by replacing the inside atmosphere with a nitrogen gas and heated such that the highest temperature became 400° C. to imidate the polyimide precursor layer, whereby a circuit-forming substrate having the polyimide resin layer on one surface of the long stainless steel foil was prepared.

When the cross section of the circuit-forming substrate obtained was observed by a scanning type electron microscope, the thickness of the polyimide resin layer formed was about 5 μm. Also, when the substrate was bent at 90 degree with the polyimide resin layer side outside, no crack was formed in the polyimide resin layer.

Furthermore, after the stainless steel foil of the substrate was removed by etching with ferric chloride to leave the polyimide resin layer only, elongation percentage of the polyimide resin layer was measured. It proved that the polyimide resin layer had an elongation percentage of 48%.

Example 16

A circuit-forming substrate having a polyimide resin layer on one surface of a long stainless steel foil was prepared in the same manner as in Example 15 except that 3,3',4,4'-benzophenonetetracarboxylic dianhydride was used in place of pyromellitic acid dianhydride and the compounding amount of Michler's ketone dianhydride was changed to 10 parts.

The elongation percentage of the polyimide resin layer of the substrate was 35% and when the bending test was carried out in the same manner as in Example 15, no crack formed in the polyimide resin layer was observed.

Example 17

To the polyimide precursor solution prepared in Example 15, 4-(2'-nitrophenyl)-2,6-dimethyl-3,5-dicarbomethoxy-1,4-dihydropyridine (customary name: nifedipine) as a photosensitive agent was added in an amount of 30 parts to 100 parts of the solid component of the polyimide precursor in place of diethylaminoethyl methacrylate and Michler's ketone to thereby impart a photosensitivity to the polyimide precursor solution, the solution was uniformly coated on a long stainless steel foil (SUS 304, thickness 30 μm) by flow-casting by the same manner as in Example 15 and dried at 80° C.

Then, after light-irradiating (wavelengths of from 360 to 440 nm, irradiation energy 500 mJ/cm$^2$) the coated layer through a photomask having a desired pattern, the layer was subjected to heat treatment at 160° C. Thereafter, the light-exposed layer was developed with a mixed solution of a 5% by weight aqueous solution of tetramethylammonium hydroxide/ethyl alcohol (2/1 by volume) as a developer at 40° C., washed with water, and dried to form a polyimide precursor layer having the desired pattern on the stainless steel foil.

Then, the long stainless steel foil having the patterned polyimide precursor layer was heated in a batch atmosphere heating furnace in a vacuum state (0.1 torr) such that the highest temperature became 380° C. to imidate the polyimide precursor layer, whereby a circuit-forming substrate having the patterned polyimide resin layer (thickness about 5 μm) on the surface of the long stainless steel foil was prepared.

The elongation percentage of the polyimide resin layer in the substrate obtained was 39% and when the substrate was subjected to the bending test as in Example 15, no crack formed in the polyimide resin layer was observed.

Example 18

The circuit-forming substrate having the patterned polyimide resin layer (thickness about 5 μm) on one surface of the long stainless steel foil obtained in Example 17 was continuously subjected to a metallizing treatment with chromium and copper in the same batch using a long sputtering apparatus.

Observation of the cross section of the substrate by a scanning type electron microscope proved that the thickness of the chromium layer was 500 Å and the thickness of the copper layer was 1,000 Å.

Then, electrolytic plating treatment of copper was applied to further form a copper layer within one hour after applying the sputtering treatment so as not to lower the activity of the sputtered layers. Thus, the circuit-forming substrate having a conductor layer was obtained.

Measurement of the plated layer by a stylus type surface roughness tester proved that the plated layer had a thickness of from 9 to 10 μm with 10 cm square width and a layer thickness accuracy of 9 μm ±10%.

When the substrate obtained was subjected to the bending test as in Example 15, no crack formed in the polyimide resin layer was observed.

Comparative Example 4

A circuit-forming substrate was prepared in the same manner as in Example 15 except that paramine was used in place of 4,4'-diamiodiphenyl ether as the monomer used for the synthesis of the polyimide precursor.

The elongation percentage of the polyimide resin layer of the obtained substrate was 16% and when the substrate was subjected to the bending test as in Example 15, the polyimide resin layer had large cracks to such an extent that an inferior insulation was caused.

While the invention has been described in detail with reference to specific embodiments, it will be apparent to one skilled in the art that various changes and modifications can be made to the invention without departing from its spirit and scope.

What is claimed is:

1. A circuit-forming substrate comprising a long stainless steel foil of 10 to 30 μm thickness and having formed wholly or partially on one surface or both surfaces thereof a photosensitive polyimide resin layer containing a photosensitive agent.

2. The circuit-forming substrate of claim 1, wherein the polyimide resin has a structural unit represented by formula (1):

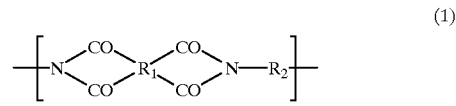

(1)

wherein $R_1$ is at least one selected from the group consisting of

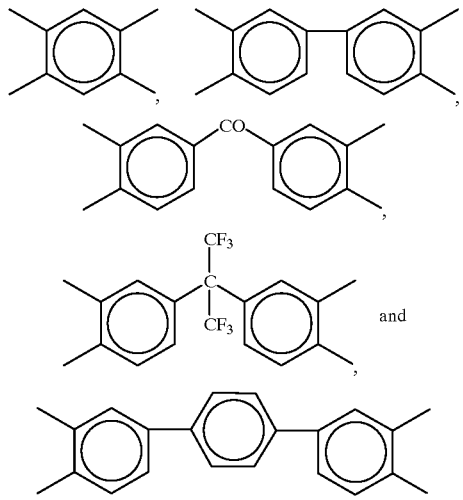

and $R_2$ is at least one selected from the group consisting of

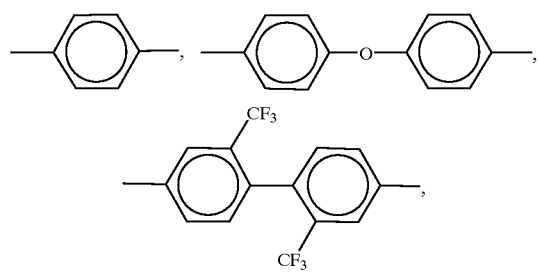

-continued

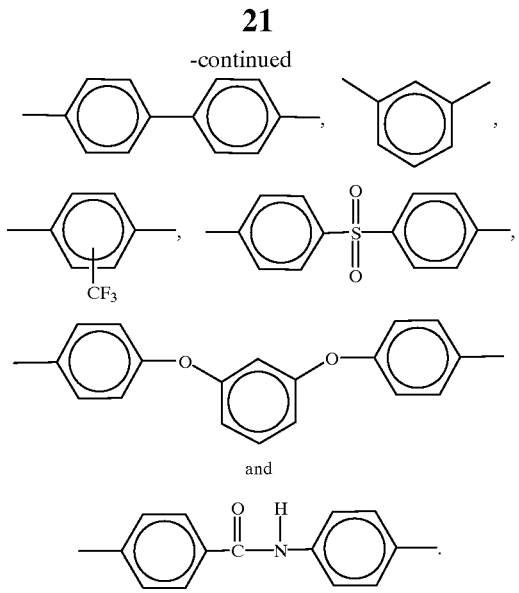

and

3. The circuit-forming substrate of claim 1, wherein the polyimide resin has a structural unit represented by formula (2):

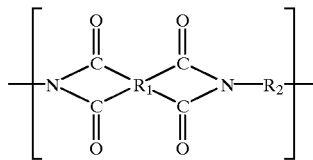
(2)

wherein $R_1$ represents

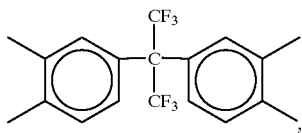

and $R_2$ is at least one selected from the group consisting of

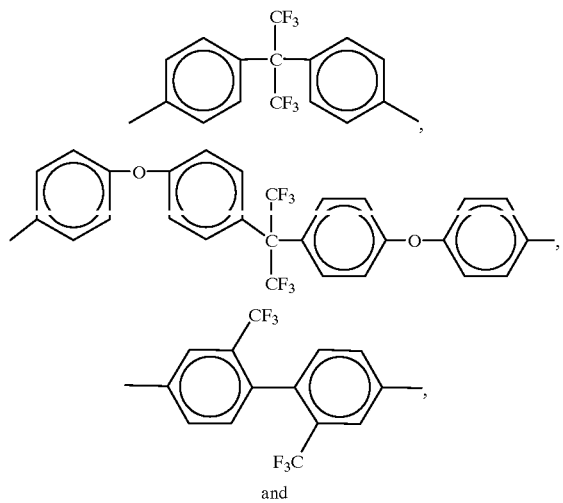

and

-continued

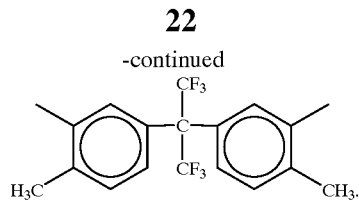

4. The circuit-forming substrate of claim 1, wherein the polyimide resin has a structural unit represented by formula (3):

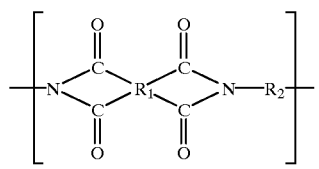
(3)

wherein $R_1$ represents a tetravalent aromatic group and $R_2$ represents a divalent aromatic group.

5. The circuit-forming substrate of claim 1, wherein the water absorption of the polyimide resin layer is not higher than 0.7% by weight.

6. The circuit-forming substrate of claim 1, wherein the elongation percentage of the polyimide resin layer is not lower than 20%.

7. The circuit-forming substrate of claim 1, wherein the difference (n) between the average linear expansion coefficient of the polyimide resin layer ($\alpha 1$) and the average linear expansion coefficient of the long stainless steel foil ($\alpha 2$) in the temperature range of from 5 to 200° C. is in the range of −5 ppm to 5 ppm.

8. The circuit-forming substrate of claim 1, wherein a conductor layer is formed on the polyimide resin layer by laminating a copper layer thereon via a chromium layer or a titanium layer or directly.

9. The circuit-forming substrate of claim 8, wherein the polyimide resin layer is formed by a photosensitive polyimide resin containing a photosensitive agent.

10. The circuit-forming substrate of claim 1, wherein the difference (n) between the average linear expansion coefficient of the polyimide resin layer ($\alpha 1$) and the average linear expansion coefficient of the long stainless steel foil ($\alpha 2$), and the difference (m) between $\alpha 1$ and the average linear expansion coefficient of the conductor layer ($\alpha 3$) in the temperature range of from 5 to 200° C. each is in the range of −5 ppm to 5 ppm.

11. A circuit-forming substrate comprising a long stainless steel foil of 10 to 30 μm thickness and having coated wholly or partially, on one surface or both surfaces thereof, a polyimide precursor solution comprising a polyimide precursor containing a photosensitive agent.

* * * * *